(12) United States Patent
Cho

(10) Patent No.: US 12,260,095 B2
(45) Date of Patent: Mar. 25, 2025

(54) MEMORY DEVICE AND METHOD OF OPERATING THE SAME

(71) Applicant: SK hynix Inc., Icheon-si (KR)

(72) Inventor: Ka Young Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 105 days.

(21) Appl. No.: 17/993,437

(22) Filed: Nov. 23, 2022

(65) Prior Publication Data

US 2023/0409208 A1    Dec. 21, 2023

(30) Foreign Application Priority Data

Jun. 16, 2022    (KR) .......................... 10-2022-0073486

(51) Int. Cl.
*G06F 3/06*    (2006.01)

(52) U.S. Cl.
CPC .......... *G06F 3/0619* (2013.01); *G06F 3/0653* (2013.01); *G06F 3/0679* (2013.01)

(58) Field of Classification Search
CPC .... G06F 3/0619; G06F 3/0653; G06F 3/0679; G11C 11/5628; G11C 16/0483; G11C 16/10; G11C 16/3459
USPC ....................................................... 711/103
See application file for complete search history.

(56) References Cited

U.S. PATENT DOCUMENTS

| | | | | |
|---|---|---|---|---|
| 2014/0226412 A1* | 8/2014 | Yeh | ..................... | G11C 16/3418 |
| | | | | 365/185.21 |
| 2016/0172047 A1* | 6/2016 | Jeon | ....................... | G11C 16/16 |
| | | | | 365/185.11 |
| 2018/0061504 A1* | 3/2018 | Kim | ........................ | G11C 16/16 |
| 2018/0286492 A1* | 10/2018 | Lee | ........................ | G11C 29/44 |
| 2021/0166771 A1* | 6/2021 | Jung | ....................... | G11C 16/10 |
| 2022/0359024 A1* | 11/2022 | Pitner | ................. | G11C 11/5628 |
| 2023/0298667 A1* | 9/2023 | Guo | ........................ | G11C 16/10 |
| | | | | 365/185.19 |
| 2023/0402099 A1* | 12/2023 | Zhang | ................. | G11C 11/5628 |

FOREIGN PATENT DOCUMENTS

| | | |
|---|---|---|
| KR | 1020110119329 A | 11/2011 |
| KR | 1020160075064 A | 6/2016 |

* cited by examiner

*Primary Examiner* — Hashem Farrokh
(74) *Attorney, Agent, or Firm* — WILLIAM PARK & ASSOCIATES LTD.

(57) ABSTRACT

A memory device includes a memory cell array including a plurality of memory cells connected to a plurality of word lines, a peripheral circuit configured to perform a program operation and a verify operation on selected memory cells among the plurality of memory cells, a compensation operation controller configured to determine a compensation value for a plurality of verify voltages according to a progress degree of the program operation and a target program state based on compensation information during the verify operation, and a verify operation controller configured to control the peripheral circuit to perform the verify operation on the selected memory cells among the plurality of memory cells based on the plurality of verify voltages and the compensation value.

19 Claims, 13 Drawing Sheets

FIG. 7

| Target PV | Start Loop | End Loop | Step Loop | Offset Bias |
|---|---|---|---|---|
| PV1 | | | | |
| PV2 | 5 | 30 | 3 | 50mV |
| PV3 | | | | |
| ⋮ | | | | |
| PV15 | | | | |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0073486, filed on Jun. 16, 2022, in the Korean Intellectual Property Office, the entire disclosure of which is incorporated herein by reference.

BACKGROUND

1. Technical Field

The present disclosure relates to an electronic device, and more particularly, to a memory device and a method of operating the same performing a program operation and a verify operation.

2. Related Art

A storage device is a device that stores data under the control of a host device such as a computer or a smartphone. The storage device may include a memory device in which data is stored and a memory controller controlling the memory device. The memory device may be a volatile memory device or a nonvolatile memory device.

A nonvolatile memory device is a device that does not lose data even though power is cut off. A nonvolatile memory device may include read only memory (ROM), programmable ROM (PROM), electrically programmable ROM (EPROM), electrically erasable and programmable ROM (EEPROM), flash memory, and/or the like.

A nonvolatile memory device performs electrical program and erase operations by changing a threshold voltage of a memory cell while moving an electron. Due to a characteristic of the program operation using the electron and the verify operation verifying the program operation, a problem in which a current flow abnormally between a bit line and a source line may occur due to a source line bouncing phenomenon. That is, completion of the program operation and the verify operation may be delayed due to source line bouncing, and reliability of an operation result may be reduced.

SUMMARY

An embodiment of the present disclosure provides a memory device and a method of operating the same supporting an improved compensation operation in a verify operation.

According to an embodiment of the present disclosure, a memory device may include a memory cell array including a plurality of memory cells connected to a plurality of word lines, a peripheral circuit configured to perform a program operation on selected memory cells among the plurality of memory cells and a verify operation on the program operation, a compensation operation controller configured to determine a compensation value for a plurality of verify voltages according to a progress degree of the program operation and a target program state based on compensation information during the verify operation, and a verify operation controller configured to control the peripheral circuit to perform the verify operation on the selected memory cells among the plurality of memory cells based on the plurality of verify voltages and the compensation value.

According to an embodiment of the present disclosure, a method of operating a memory device may include a programming step of programming selected memory cells among a plurality of memory cells by using a program voltage, and a program verify step of verifying a threshold voltage of the selected memory cells by using a plurality of verify voltages. The program verify step may determine a plurality of compensation values respectively corresponding to the plurality of verify voltages based on compensation information, and verify the threshold voltage of the selected memory cells based on the plurality of verify voltages and the plurality of compensation values.

According to an embodiment of the present disclosure, a storage device may include a memory device including a plurality of memory cells connected to a plurality of word lines, and a memory controller configured to control the memory device. The memory device may include a peripheral circuit configured to perform a program operation on selected memory cells among the plurality of memory cells and a verify operation on the program operation, and control logic configured to control the peripheral circuit to determine a compensation value for a plurality of verify voltages according to a progress degree of the program operation and a target program state based on compensation information, and to perform the verify operation based on the plurality of verify voltages and the compensation value.

According to the present technology, a memory device and a method of operating the same supporting an improved compensation operation in a verify operation are provided.

BRIEF DESCRIPTION OF THE DRAWINGS

FIG. 7 is a diagram illustrating compensation information according to an embodiment of the present disclosure.

DETAILED DESCRIPTION

Specific structural or functional descriptions of embodiments according to the concept of the present disclosure disclosed in the present specification or application are illustrated only to describe the embodiments according to the concept of the present disclosure. The embodiments according to the concept of the present disclosure may be carried out in various forms and are not limited to the embodiments described in the present specification or application.

Figure 1:
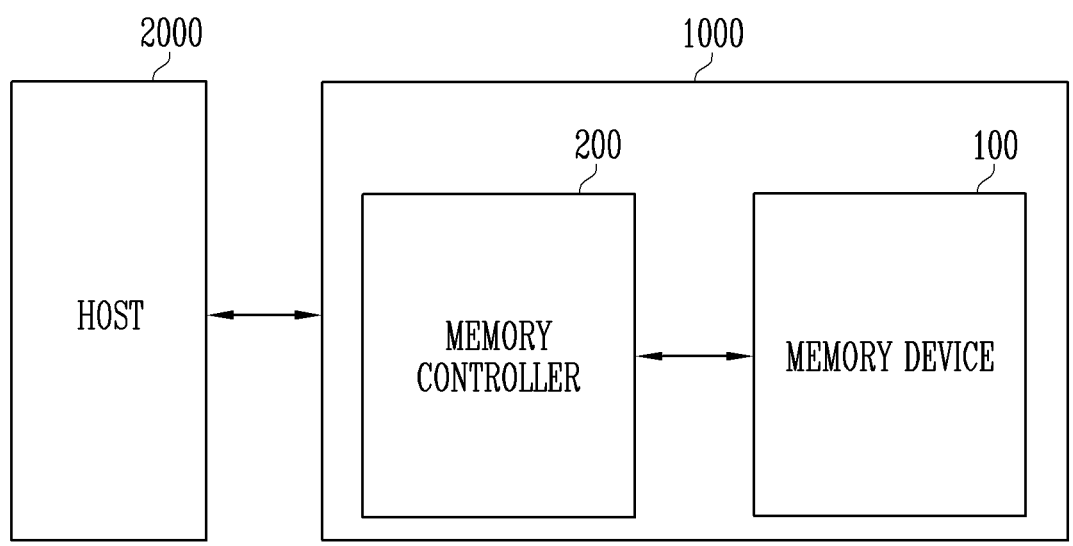
FIG. 1 is a diagram illustrating a storage device according to an embodiment of the present disclosure.

FIG. 1 is a diagram illustrating a storage device according to an embodiment of the present disclosure.

Referring to FIG. 1, the storage device 1000 may include a memory device 100 and a memory controller 200.

The storage device 1000 may be a device that stores data under control of a host 2000 such as a cellular phone, a smartphone, an MP3 player, a laptop computer, a desktop computer, a game player, a display device, a tablet PC, or an in-vehicle infotainment system.

The storage device 1000 may be implemented as one of various types of storage devices according to a host interface that is a communication method with the host 2000. For example, the storage device 1000 may be implemented as any one of various types of storage devices such as an SSD, a multimedia card in a form of an MMC, an eMMC, an RS-MMC and a micro-MMC, a secure digital card in a form of an SD, a mini-SD, and a micro-SD, a universal serial bus (USB) storage device, a universal flash storage (UFS) device, a personal computer memory card international association (PCMCIA) card type of storage device, a peripheral component interconnection (PCI) card type of storage device, a PCI express (PCI-E) card type of storage device, a compact flash (CF) card, a smart media card, and a memory stick.

The storage device 1000 may be implemented as any one of various types of packages. For example, the storage device 1000 may be implemented as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data or use the stored data. Specifically, the memory device 100 may operate in response to control of the memory controller 200. In addition, the memory device 100 may include a plurality of memory dies, and each of the plurality of memory dies may include a memory cell array including a plurality of memory cells storing data.

Each of the memory cells may be configured as a single-level cell (SLC) that stores one data bit, a multi-level cell (MLC) that stores two data bits, a triple-level cell (TLC) that stores three data bits, or a quad-level cell (QLC) that stores four data bits.

The memory cell array may include a plurality of memory blocks. Each memory block may include a plurality of memory cells, and one memory block may include a plurality of pages. Here, a page may be one unit for storing data in the memory device 100 or reading the data stored in the memory device 100.

The memory device 100 may be implemented using double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 uses NAND flash memory.

The memory device 100 may receive a command and an address from the memory controller 200. The memory device 100 may be configured to access an area selected by the received address in the memory cell array. Accessing the selected area may mean performing an operation corresponding to the received command on the selected area. For example, the memory device 100 may perform a write operation (a program operation), a read operation, and an erase operation. Here, the program operation may be an operation in which the memory device 100 writes data to the area selected by the address. The read operation may mean an operation in which the memory device 100 reads data from the area selected by the address. The erase operation may mean an operation in which the memory device 100 erases data stored in the area selected by the address.

During a verify operation on the program operation, a potential of a source line may increase, and a source line bouncing phenomenon that prevents a flow of a current between the source line and a bit line may occur due to the increased potential of the source line. According to an embodiment of the present disclosure, the memory device 100 may correct a level of a verify voltage during the verify operation to ensure reliability of the program operation and the verify operation due to the source line bouncing phenomenon.

The memory controller 200 may receive data and a logical address (LA) from the host 2000, and may convert the LA into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, the erase operation, or the like according to a request of the host 2000. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation by itself regardless of a request from the host 2000. For example, the memory controller 200 may control the memory device 100 to perform the program operation, the read operation, or the erase operation used to perform a background operation such as wear leveling, garbage collection, and read reclaim.

Figure 2:
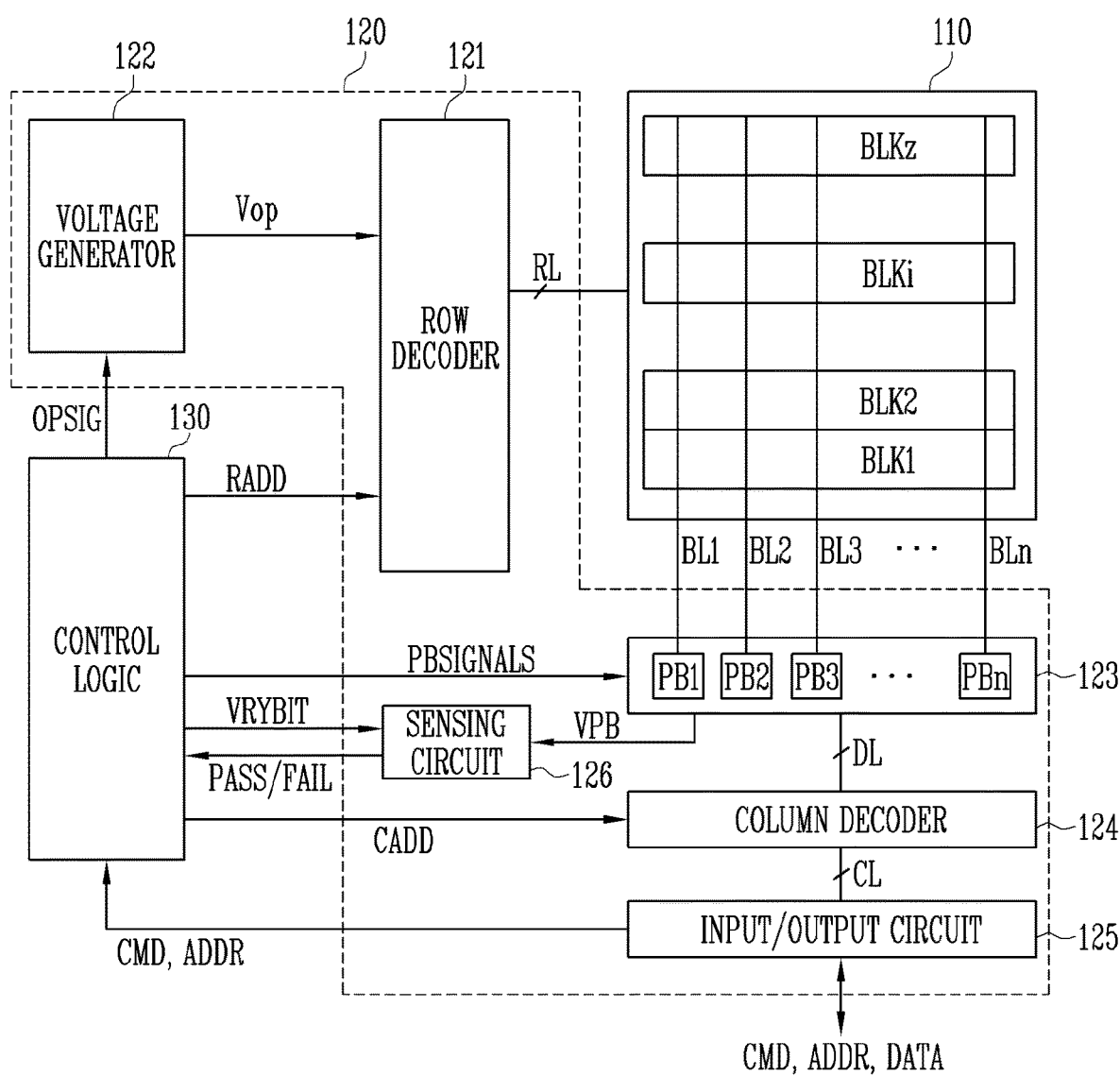
FIG. 2 is a diagram illustrating a memory device according to an embodiment of the present disclosure.

FIG. 2 is a diagram illustrating the memory device according to an embodiment of the present disclosure.

Referring to FIG. 2, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be connected to a row decoder 121 through row lines RL. Here, the row lines RL may include at least one source select line, a plurality of word lines, and at least one drain select line. The plurality of memory blocks BLK1 to BLKz may be connected to a page buffer group 123 through bit lines BL1 to BLn. Each of the plurality of memory blocks BLK1 to BLKz may include a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on the selected area of the memory cell array 110 under control of the control logic 130. That is, the peripheral circuit 120 may drive the memory cell array 110 under the control of the control logic 130. For example, the peripheral circuit 120 may apply various operation voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In addition, the row lines RL may further include a pipe select line.

The row decoder 121 may be configured to operate in response to the control of the control logic 130. The row decoder 121 may receive a row address RADD from the control logic 130. Specifically, the row decoder 121 may be configured to decode the row address RADD. The row decoder 121 may select at least one of the memory blocks BLK1 to BLKz according to a decoded row address RADD. In addition, the row decoder 121 may select at least one word line of the memory block selected to apply the voltages generated by the voltage generator 122 to at least one word line according to the decoded address.

For example, during the program operation, the row decoder 121 may apply the program voltage to a selected word line and apply a program pass voltage of a level lower than that of the program voltage to an unselected word line. During a program verify operation, the row decoder 121 may apply a verify voltage to the selected word line and apply a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory cell array 110 may be performed in a memory block unit. During the erase operation, the row decoder 121 may select one memory block according to the decoded address, and the row decoder 121 may apply a ground voltage to word lines connected to the selected memory block.

The voltage generator 122 may operate in response to the control of the control logic 130. The voltage generator 122 may be configured to generate a plurality of voltages using an external power voltage supplied to the memory device 100. For example, the voltage generator 122 may generate the program voltage, the verify voltage, the pass voltage, the read voltage, the erase voltage, and the like in response to the control of the control logic 130. That is, the voltage generator 122 may generate various operation voltages Vop used for the program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages using the external power voltage or the internal power voltage. For example, the voltage generator 122 may include a plurality of pumping capacitors that receive the internal power voltage, and may selectively activate the plurality of pumping capacitors to generate the plurality of voltages, in response to the control of the control logic 130. In addition, the generated voltages may be supplied to the memory cell array 110 by the row decoder 121.

The page buffer group 123 may include first to n-th page buffers PB1 to PBn. The first to n-th page buffers PB1 to PBn may be connected to the memory cell array 110 through the first to n-th bit lines BL1 to BLn, respectively. In addition, the first to n-th page buffers PB1 to PBn may operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when a program pulse is applied to the selected word line, the first to n-th page buffers PB1 to PBn may transfer data DATA received through the input/output circuit 125 to the selected memory cells through the first to n-th bit lines BL1 to BLn. The memory cells of the selected page may be programmed according to the transferred data DATA. A memory cell connected to a bit line to which a program allowable voltage (for example, a ground voltage) is applied may have an increased threshold voltage. A threshold voltage of a memory cell connected to a bit line to which a program inhibition voltage (for example, a power voltage) is applied may be maintained.

During the program verify operation, the first to n-th page buffers PB1 to PBn may read page data from the selected memory cells through the first to n-th bit lines BL1 to BLn.

During the read operation, the first to n-th page buffers PB1 to PBn may read the data DATA from the memory cells of the selected page through the first to n-th bit lines BL1 to BLn, and output the read data DATA to the input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 to the control logic 130, or may exchange the data DATA with the column decoder 124.

The sensing circuit 126 may generate a reference current in response to an allowable bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the allowable bit signal VRYBIT in response to the command CMD and the address ADDR to control the peripheral circuit 120.

In addition, the control logic 130 may determine whether the verify operation is passed or failed in response to the pass signal PASS or the fail signal FAIL. In addition, the control logic 130 may control the page buffer group 123 to temporarily store verify information including the pass signal PASS or the fail signal FAIL in the page buffer group 123. Specifically, the control logic 130 may determine a program state of a memory cell in response to the pass signal PASS or the fail signal FAIL. For example, when the memory cell operates as the TLC, the control logic 130 may determine whether the program state of the memory cell is an erase state E or any one of first to seventh program states P1 to P7.

Figure 3:
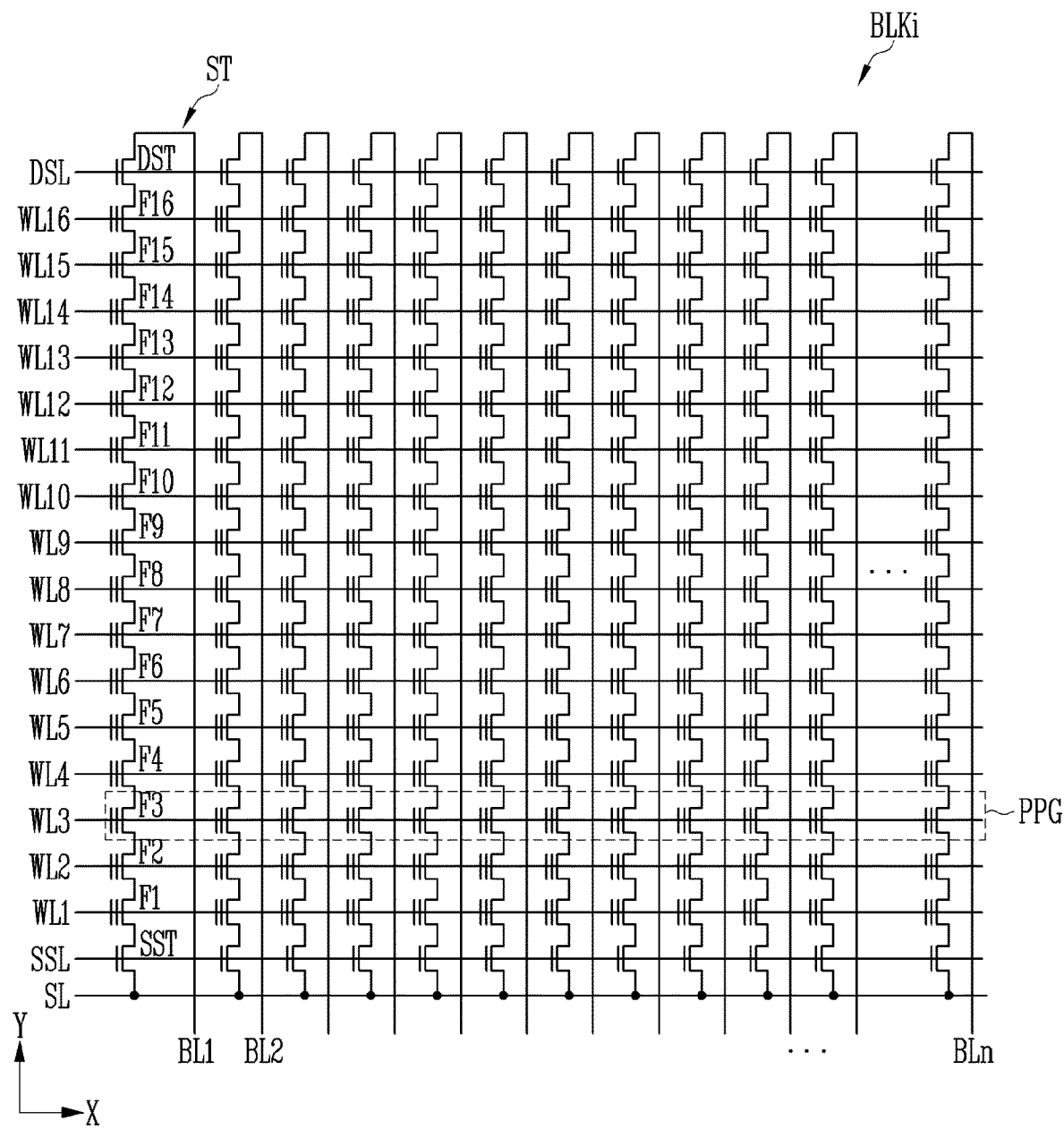
FIG. 3 is a diagram illustrating a memory block according to an embodiment of the present disclosure.

FIG. 3 is a diagram illustrating a memory block according to an embodiment of the present disclosure.

Referring to FIG. 3, in the memory block BLKi, a plurality of word lines arranged in parallel with each other may be connected between a first select line and a second select line. Here, the first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be connected to the strings ST, respectively, and the source line SL may be commonly connected to the strings ST. Because the strings ST may be configured to be identical to each other, a string ST connected to the first bit line BL1 is specifically described as an example.

The string ST may include a source select transistor SST, a plurality of memory cells F1 to F16, and a drain select transistor DST connected in series between the source line SL and the first bit line BL1. One string ST may include at least one or more source select transistors SST and at least one or more drain select transistors DST, and may include the memory cells more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a physical page PPG. Therefore, the memory block BLKi may include the physical pages PPG of the number of the word lines WL1 to WL16.

Each of the memory cells may be configured as an SLC that stores one data bit, an MLC that stores two data bits, a TLC that stores three data bits, or a QLC capable of storing four data bits.

An SLC may store one bit of data. One physical page PPG of an SLC may store one logical page (LPG) data. One logical page (LPG) data may include data bits corresponding to the number of cells included in one physical page PPG.

An MLC, a TLC, and a QLC may store two or more bits of data. In this case, one physical page PPG may store two or more logical page (LPG) data.

Figure 4:
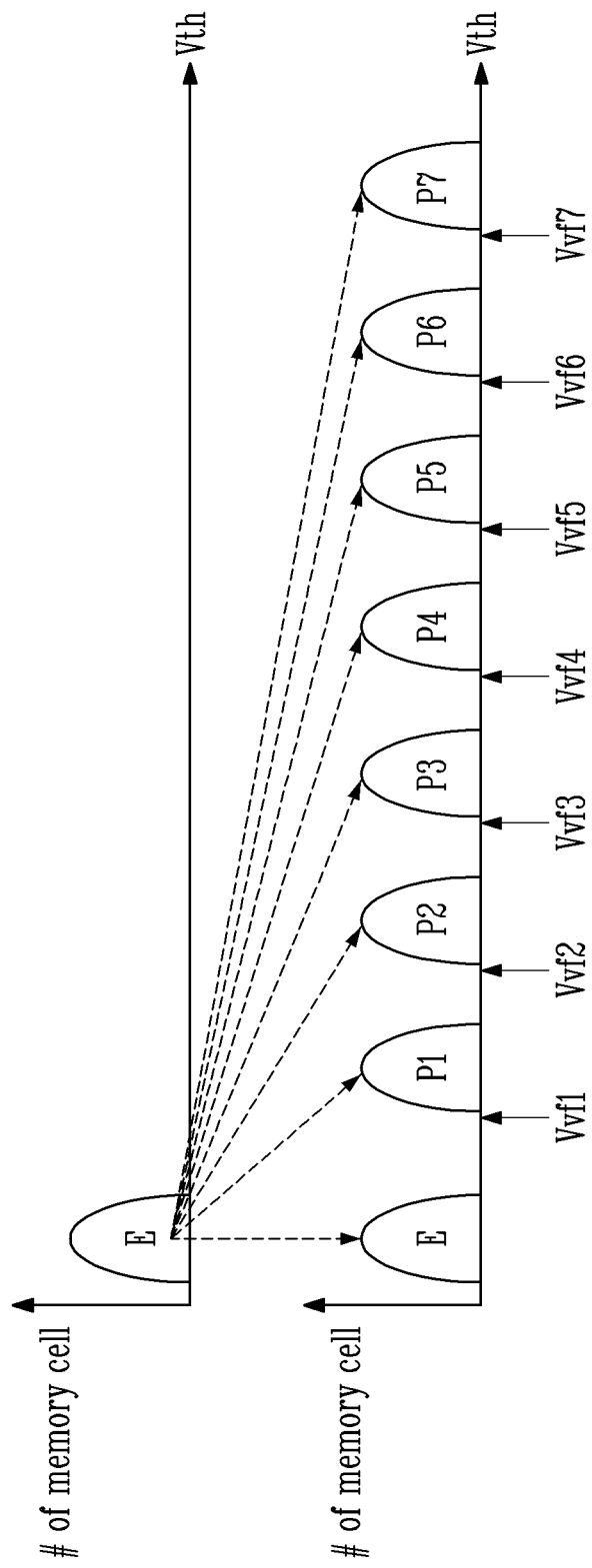
FIG. 4 is a diagram illustrating a program operation and a verify operation according to an embodiment of the present disclosure.

FIG. 4 is a diagram illustrating a program operation and a verify operation according to an embodiment of the present disclosure.

Referring to FIG. 4, the memory cell may be programmed to an erase state E or first to seventh program states P1 to P7 according to a threshold voltage. Although the memory cell of FIG. 4 is shown as a TLC that may be programmed to one erase state and seven program states, this is merely an embodiment for convenience of description. In implementation, the memory cell may be implemented as an MLC, an SLC, a QLC, and the like. In addition, although the erase state and the program state are divided for convenience of description, the erase state may be expressed as a 0-th program state P0. Therefore, the erase state E and the first to seventh program states P1 to P7 shown in FIG. 4 may be expressed as 0-th to seventh program states.

Memory cells connected to the selected word line may have a threshold voltage included in any one of the erase state E and the first to seventh program states P1 to P7. That is, the memory cells may be programmed to have the threshold voltage included in any one of the erase state E and the first to seventh program states P1 to P7. Before the program operation is performed, the memory cells may be in the erase state E. During the program operation, the memory cells in the erase state E may be programmed to any one of the seven program states as the program voltage is applied to the selected word line.

In addition, as a result of the program operation, for example, the erase state E or the first to seventh program states P1 to P7 may be verified using the verify voltage. Specifically, the verify operation may include a sensing operation of applying the verify voltage to each memory cell and checking a state of a flowing current or a voltage according to the applied verify voltage to identify whether the memory cell is an on cell or an off cell. During the sensing operation, the storage device 1000 may set the verify voltage based on a threshold voltage value of the memory cells, and may distinguish whether the memory cells are the on cells or off cells by using the set verify voltage. Specifically, the erase state E and the first program state P1 may be divided into the on cell and the off cell, respectively, by a first verify voltage Vvf1. The first program state P1 and the second program state P2 may be divided into the on cell and the off cell, respectively, by a second verify voltage Vvf2. The second program state P2 and the third program state P3 may be divided into the on cell and the off cell, respectively, by a third verify voltage Vvf3. The third program state P3 and the fourth program state P4 may be divided into the on cell and the off cell, respectively, by a fourth verify voltage Vvf4. The fourth program state P4 and the fifth program state P5 may be divided into the on cell and the off cell, respectively, by a fifth verify voltage Vvf5. The fifth program state P5 and the sixth program state P6 may be divided into the on cell and the off cell, respectively, by a sixth verify voltage Vvf6. The sixth program state P6 and the seventh program state P7 may be divided into the on cell and the off cell, respectively, by a seventh verify voltage Vvf7. That is, during the sensing operation, the storage device 1000 may set a level of the verify voltage to be higher than a maximum value of an on cell distribution to be divided and set the level of the verify voltage to be lower than a minimum value of an off cell distribution, to distinguish the memory cells are the on cells or the off cells.

In addition, specifically, the storage device 1000 may identify a distribution of a specific memory cell by applying the first to seventh verify voltages Vvf1 to Vvf7 to the specific memory cell. For example, in a case where the specific memory cell is programmed to the fourth program state P4, when the first to fourth verify voltages are applied, the specific memory cell may be sensed as the off cell, and when fifth to seventh verify voltages are applied, the specific memory cell may be sensed as the on cell. In addition, the storage device 1000 may identify that the specific memory cell is programmed to the fourth program state P4 by combining sensed results. The storage device 1000 may identify a program state of the plurality of memory cells by the same method, and may convert the identified program states into data by combining the identified program states.

Figure 5:
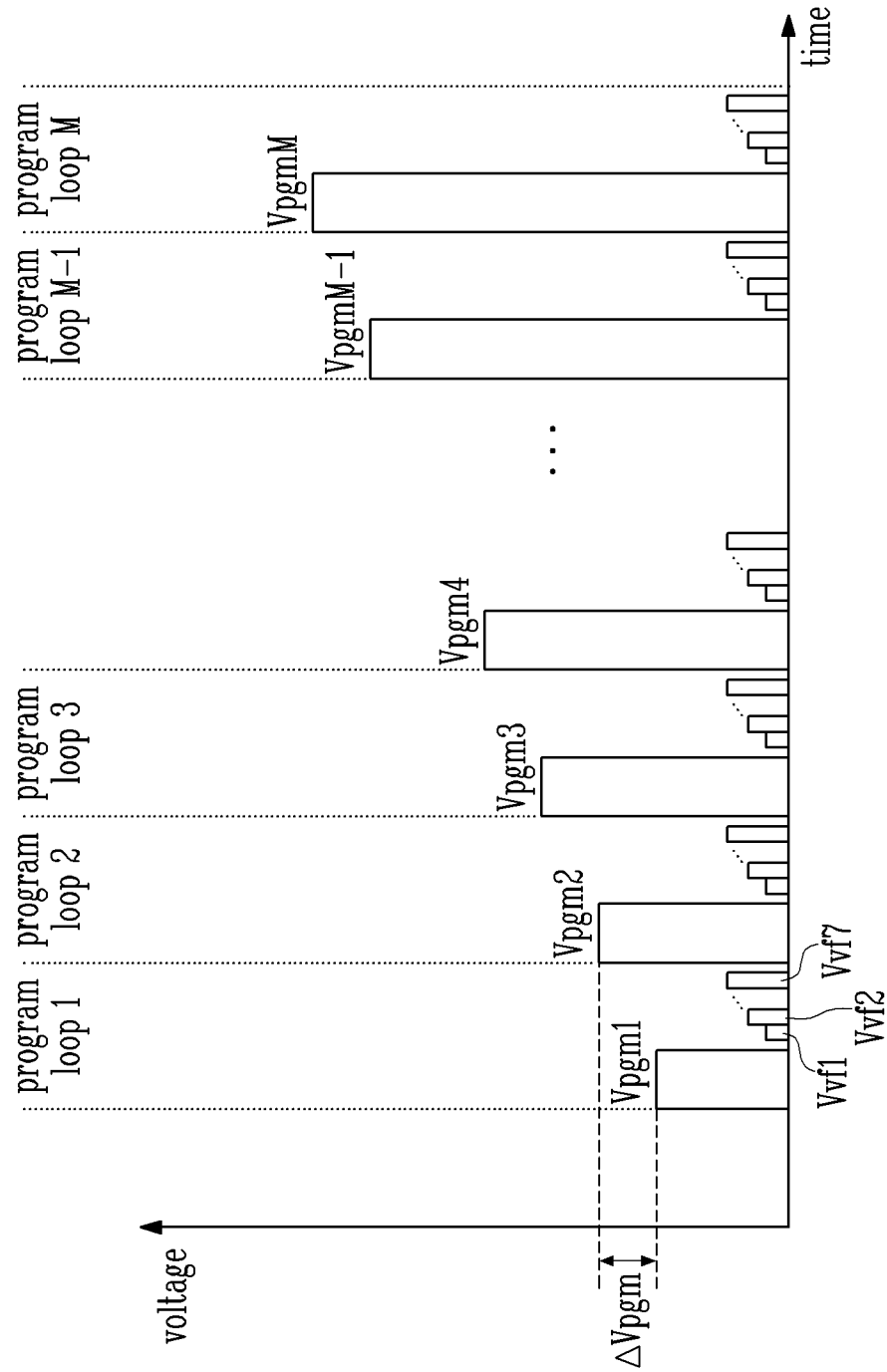
FIG. 5 is a diagram illustrating a program operation and a verify operation according to an embodiment of the present disclosure.

FIG. 5 is a diagram illustrating a program operation and a verify operation according to an embodiment of the present disclosure.

Referring to FIG. 5, the program operation for forming a plurality of program states may include M program loops. Each program loop may include an operation of applying the program voltage to the selected word line and an operation of applying the verify voltage to the selected word line. In FIG. 5, the "program operation" is a program operation in a broad sense, which includes the verify operation of determining whether the program operation is properly performed. In addition, the program operation may include a program period for applying the program voltage and a verify period for applying the verify voltage. The operation of applying the program voltage to the selected word line may be an operation of increasing the threshold voltage of the memory cell, and the operation of applying the verify voltage may be an operation of determining the threshold voltage to check whether the corresponding memory cell reaches a target program state. For example, a first program loop may include an operation of applying a first program voltage Vpgm1 and the plurality of verify voltages Vvf1 to Vvf7 to the selected word line. For convenience of description, it is shown that the seven verify voltages are applied in all program loops, but the number of verify voltages is not limited thereto, and only some of the seven verify voltages might be applied.

As the program loop is sequentially performed, the program voltage may increase by a step voltage ΔVpgm. This is referred to as an incremental step pulse program (ISPP) method. For example, a second program voltage Vpgm2 applied to the selected word line in the second program loop may be greater than the first program voltage Vpgm1 by the step voltage ΔVpgm. For convenience of description, the step voltage is shown as being fixed, but the step voltage may be changed dynamically.

A memory cell reaching the target program state while M program loops are in progress may be in a program inhibit state so that the program is not further progressed. Even though a subsequent program loop is progressed, a threshold voltage of the memory cell in the program inhibit state may be maintained. For example, a memory cell of which a program is completed to the second program state P2 that is the target program state in the second program loop may be in the program inhibit state during a third program loop. In an embodiment, a bit line of the memory cell reaching the target program state may be precharged to a program inhibit voltage. When the bit line is precharged to the program inhibit voltage, a channel of the memory cell may be self-boosted by the program voltage and the memory cell may not be programmed.

Figure 6:
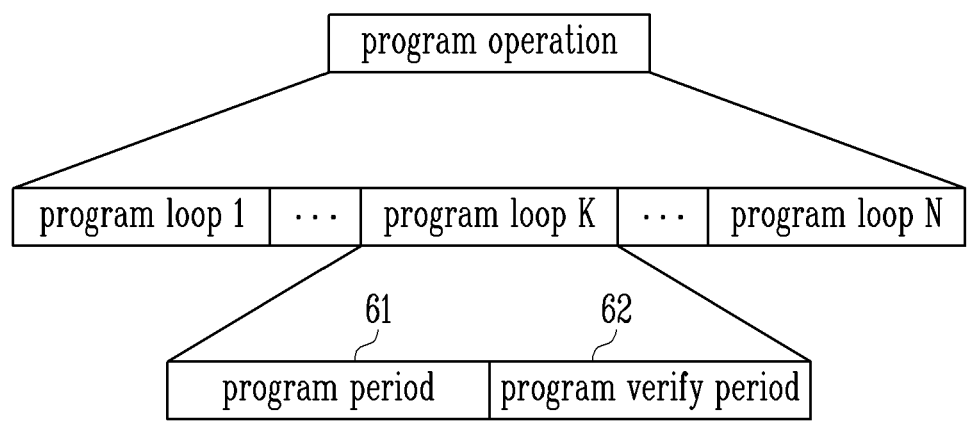
FIG. 6 is a diagram illustrating a program loop according to an embodiment of the present disclosure.

FIG. 6 is a diagram illustrating a program loop according to an embodiment of the present disclosure.

Referring to FIG. 6, the program operation may include first to N-th program loops.

Selected memory cells to be subjected to the program operation among the plurality of memory cells may be programmed to the target program states through the program operation. A plurality of program states may be divided based on the threshold voltage. For example, when the selected memory cells operate as SLC memory cells, the target program states may be divided into an erase state and a program state. When the selected memory cells operate as MLC memory cells, the target program states may be divided into one erase state and seven program states.

Each program loop may include a program period 61 and a program verify period 62. The program period 61 may be a period in which data is programmed to the selected memory cells. The program period 61 may include a precharge period, a program voltage apply period, and a discharge period. In the precharge period, a program allowable voltage may be precharged to a selected bit line, and the program inhibit voltage may be precharged to an unselected bit line. In the program voltage apply period, the program voltage may be applied to the selected word line and the pass voltage may be applied to the unselected word line. In the discharge period, the voltage precharged to the bit line and the voltage applied to the word line may be discharged. That is, the program period 61 may be a period for causing the program state of the selected memory cells to be in the target program state.

The program verify period 62 may be a period for verifying the program state of the programmed memory cell. Alternatively, the program verify period 62 may be a period for verifying whether the program state or the threshold voltage of the selected memory cells reaches the target program state after the program period 61.

Specifically, the program verify period 62 may include a sensing period and a check period. In addition, the sensing period may include a precharge period, an evaluation period, and a discharge period. In the precharge period, the bit lines may be precharged. In the evaluation period, the verify voltage may be applied to the selected word line and the pass voltage may be applied to the unselected word line. In the evaluation period, a voltage precharged to a bit line connected to a memory cell having a threshold voltage higher than the verify voltage may be maintained. In the evaluation period, a voltage precharged to a bit line connected to a memory cell having a threshold voltage lower than the verify voltage may be discharged in proportion to a length of the evaluation period. Voltage information regarding whether the precharged voltage is maintained or discharged may be stored in the page buffer group 123.

The check period may be a period in which it is determined whether program verification is passed or failed by using the voltage information stored in the page buffer group 123. In the check period, the sensing circuit 126 may compare the number of the memory cells having the threshold voltage lower than the verify voltage among the selected memory cells with a reference number. In addition, the sensing circuit 126 may output the pass signal or the fail signal according to a comparison result. Here, determining whether the number of selected memory cells having the threshold voltage higher than the verify voltage is greater than a first reference number may be a pass bit check operation. Determining whether the number of selected memory cells having the threshold voltage less than the verify voltage is less than a second reference number may be a fail bit check operation.

FIG. 7 is a diagram illustrating compensation information according to an embodiment of the present disclosure.

Referring to FIG. 7, a compensation information table 70 including the compensation information related to a compensation operation is shown. The compensation information table 70 may include the compensation information on the verify operations of verifying each of the plurality of program states. Specifically, compensation information 71 on a verify operation (hereinafter, a second verify operation) corresponding to the second program state PV2 may be compensation information on the second verify voltage Vvf2 for verifying the second program state PV2. The compensation information may include a start loop indicating an application time point of the compensation operation, an end loop indicating an end time point of the compensation operation, a step loop indicating the number of loops to which a compensation value of a corresponding step is applied, and an offset bias indicating a compensation value applied to the verify voltage.

For example, in the compensation information 71 on the second verify operation, the start loop may be 5, the end loop may be 30, the step loop may be 3, and the offset bias offset bias may be 50 mV. According to the compensation information 71 on the second verify operation, from a fifth program loop to which a fifth program voltage is applied to a thirtieth program loop to which a thirtieth program voltage is applied, the compensation operation may be applied. In addition, because the step loop of the compensation information 71 on the second verify operation is 3, a correction value may be changed for every three program loops such as the fifth program loop, an eighth program loop, an eleventh program loop, and a fourteenth program loop. Because the offset bias of the compensation information 71 on the second verify operation is 50 mV, the level of the verify voltage may be increased by 50 mV or decreased by 50 mV for every three program loops. That is, when the program loop is a first program loop to a fourth program loop, an initially set voltage level may be applied to the second verify voltage without correction, and when the program loop is a fifth program loop to a seventh program loop, a voltage level increased or decreased by 50 mV from the initially set voltage level may be applied to the second verify voltage. In addition, when the program loop is an eighth program loop to a tenth program loop, the second verify voltage is corrected to a voltage level increased or decreased by 100 mV from the initially set voltage level. The compensation operation on the second verify voltage may be applied until the program loop reaches the end loop. The compensation operation of the same method may be applied to the remaining verify voltages except for the second verify voltage.

Figure 8:
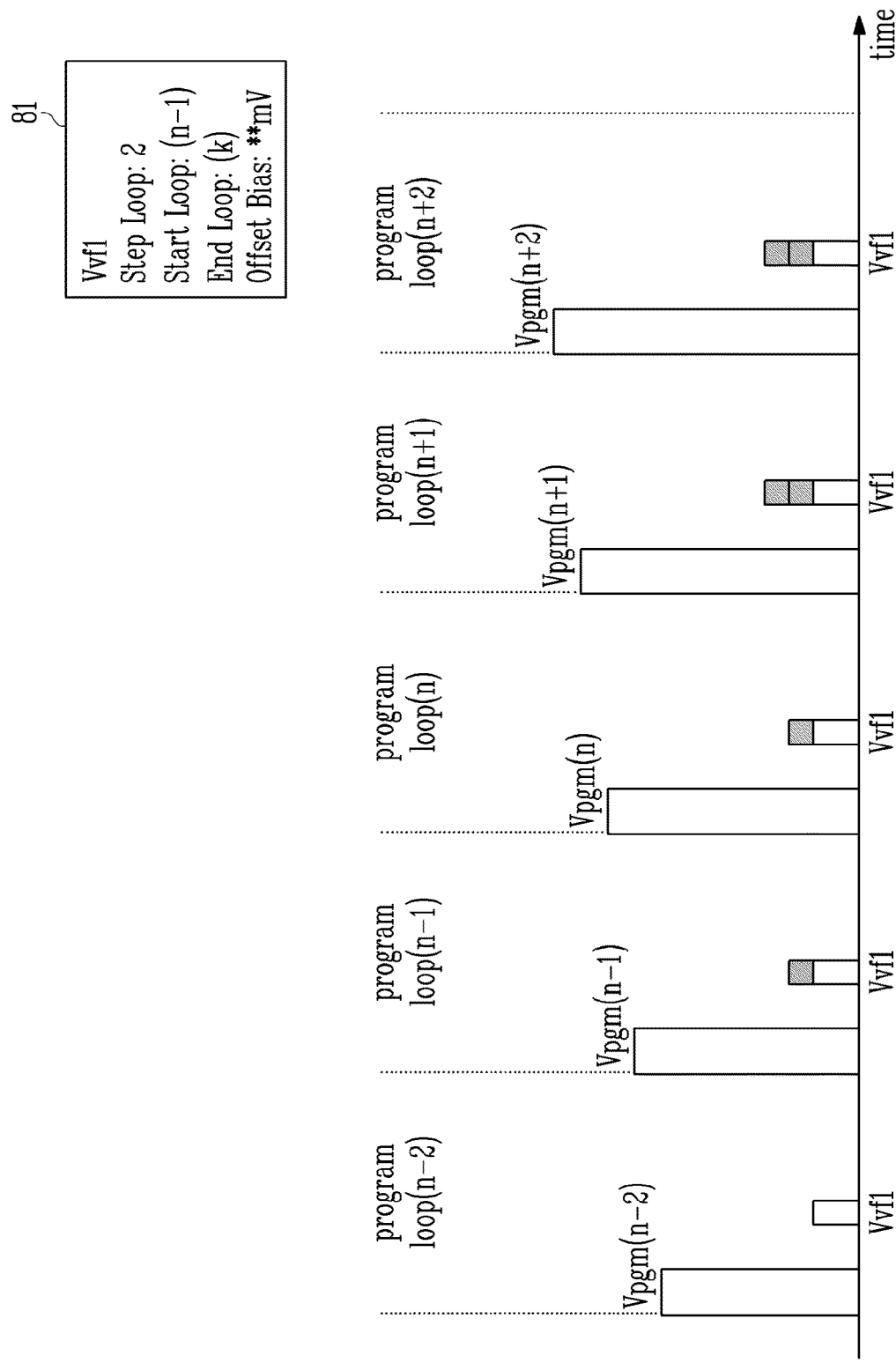
FIG. 8 is a diagram illustrating a compensation operation according to an embodiment of the present disclosure.

FIG. 8 is a diagram illustrating a compensation operation according to an embodiment of the present disclosure.

Referring to FIG. 8, a program operation in which a compensation operation is applied to the first verify voltage Vvf1 is shown. The memory device 100 may perform the compensation operation according to verify information 81 on the first verify voltage Vvf1. According to the verify information 81 on the first verify voltage Vvf1, the step loop may be 2, the start loop may be n−1, the end loop may be k, and the offset bias may be **mV. Specifically, the memory device 100 may apply the compensation operation to the first verify voltage Vvf1 from an (n−1)-th program loop according to the verify information 81 on the first verify voltage Vvf1. That is, the memory device 100 may apply the first verify voltage Vvf1 of the initially set voltage level before the (n−1)-th program loop (for example, an (n−2)-th program loop).

In addition, the memory device 100 may apply the first verify voltage Vvf1 of a voltage level increased by an offset bias from the first verify voltage applied from an (n+1)-th program loop to the (n−1)-th program loop. In addition, the memory device 100 may perform the compensation operation on the first verify voltage Vvf1 up to a k-th program loop according to the verify information 81 on the first verify voltage Vvf1.

Figure 9:
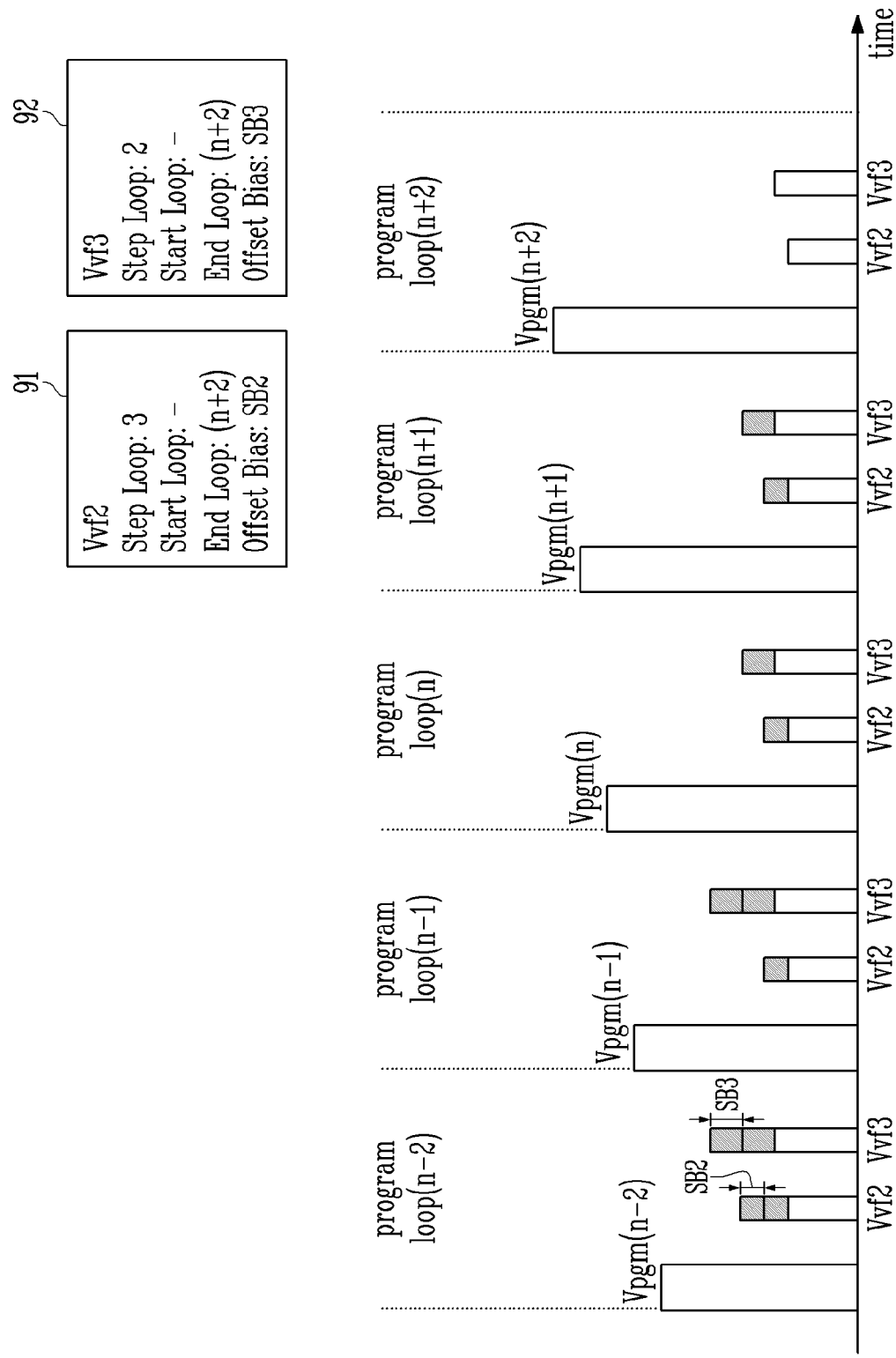
FIG. 9 is a diagram illustrating a compensation operation according to an embodiment of the present disclosure.

FIG. 9 is a diagram illustrating a compensation operation according to an embodiment of the present disclosure.

Referring to FIG. 9, a program operation in which a compensation operation is applied to the second verify voltage Vvf2 and the third verify voltage Vvf3 is shown. Referring to verify information 91 on the second verify voltage Vvf2 and verify information 92 on the third verify voltage Vvf3, the verify information 91 on the second verify voltage Vvf2 and the verify information 92 on the third verify voltage Vvf3 may be independently set. Specifically, the compensation operation on the second verify voltage Vvf2 may set the step loop to 3, and the compensation operation on the third verify voltage Vvf3 may set the step loop to 2. In addition, an offset bias SB2 for the second verify voltage Vvf2 may be set to be less than an offset bias SB3 for the third verify voltage Vvf3.

In addition, the memory device 100 may perform the verify operation according to the verify information 91 on the second verify voltage Vvf2 and the verify information 92 on the third verify voltage Vvf3.

As shown in FIG. 8, when the verify operation or the compensation operation on the verify voltage is performed, the memory device 100 may perform the verify operation so that the level of the verify voltage is increased by adding the offset bias to a correction value for the verify voltage as the program loop progresses. Alternatively, as shown in FIG. 9, the memory device 100 may perform the verify operation so that the level of the verify voltage is decreased by subtracting the correction value for the verify voltage by the offset bias as the program loop progresses.

Figure 10:
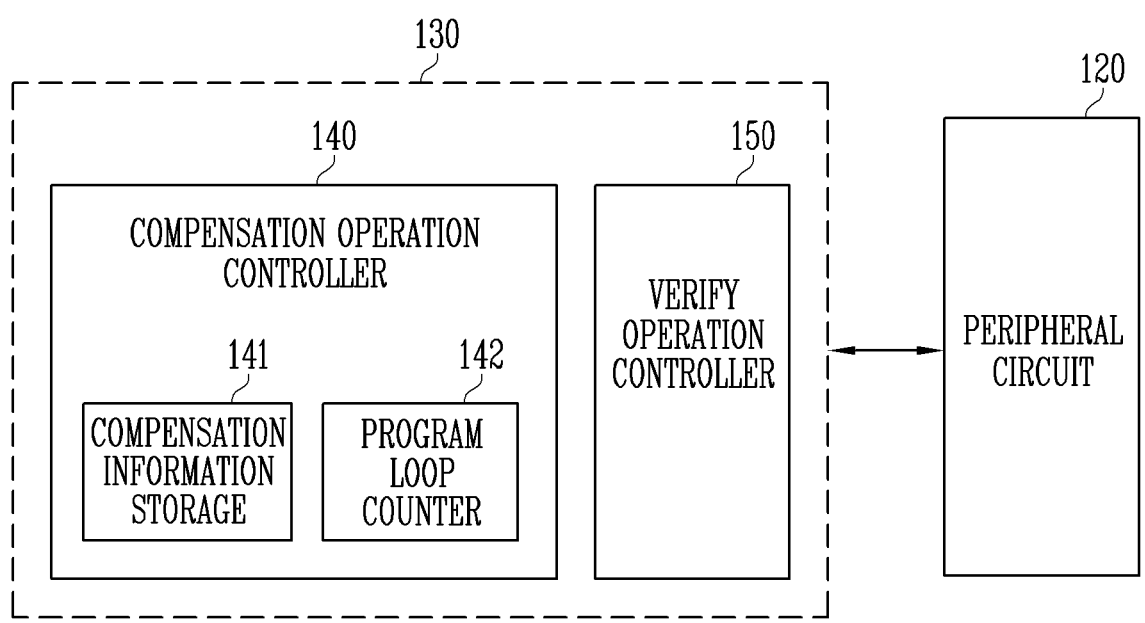
FIG. 10 is a diagram illustrating control logic according to an embodiment of the present disclosure.

FIG. 10 is a diagram illustrating control logic according to an embodiment of the present disclosure.

Referring to FIG. 10, the control logic 130 may include a compensation operation controller 140 and a verify operation controller 150. The control logic 130 may be implemented as hardware, software, or a combination of hardware and software. For example, the control logic 130 may be a control logic circuit or processor operating in accordance with an algorithm and/or a processor executing control logic code.

The compensation operation controller 140 may include a compensation information storage 141 and a program loop counter 142. The compensation information storage 141 may store compensation information including the start loop indicating the start time point of the compensation operation, the end loop indicating the end time point of the compensation operation, the step loop indicating the number of program loops to which the same compensation value is applied, and the offset value (offset bias) indicating a basic unit by which the compensation value is changed. Here, the compensation operation may refer to an operation of determining the compensation value for correcting each of the plurality of verify voltages used in the verify operation and applying the determined compensation value to the plurality of corresponding verify voltages.

The compensation information storage 141 may include the compensation information table 70 shown in FIG. 7. In addition, the compensation information storage 141 may include information on the verify voltage, for example, information on an initial verify voltage or information on an optimal verify voltage. The compensation operation controller 140 may obtain the information on the verify voltage and the compensation information from the compensation information storage 141, and calculate the compensation value based on the compensation operation controller 140 compensates based on the obtained information on the verify voltage and compensation information. The compensation value may be changed according to a progress degree of the program operation, that is, the number of program loops. For example, the compensation operation controller 140 may calculate the compensation value so that the compensation value for each of the plurality of verify voltages increases as the number of program loops increases based on the compensation information corresponding to each of the plurality of verify voltages. Alternatively, the compensation operation controller 140 may calculate the compensation value so that the compensation value for each of the plurality of verify voltages decreases as the number of program loops increases based on the compensation information corresponding to each of the plurality of verify voltages. In addition, the compensation information storage 141 may store the number of program loops counted by the program loop counter 142 for each regular period.

In addition, the program loop counter 142 may count the number of program loops. The compensation operation controller 140 may calculate the compensation value using the number of program loops counted by the program loop counter 142. According to an embodiment, when the program operation and the verify operation are stopped in response to a stop command requesting a stop of the program operation, and then the program operation and the verify operation are resumed by a resume command, the program loop counter 142 may count the number of program loops subsequent to the number of program loops stored in the compensation information storage 141 before the program operation is stopped. At this time, when the program loop is resumed, the program loop counter 142 does not additionally count the corresponding program loop. That is, the program loop of the resumed program operation is determined as the same program loop as the program loop before the stop, and thus the number of program loops is not additionally counted until the resumed program loop is ended.

The program loop counter 142 may count the number of program loops by generating a predetermined signal whenever a program loop progresses. The compensation operation controller 140 may count the number of program loops based on the signal received from the program loop counter 142. A specific content is described in detail with reference to a timing diagram of FIG. 11.

The verify operation controller 150 may generate an operation voltage control signal so that an operation voltage such as the verify voltage for performing the program verify operation and a bit line precharge voltage is applied to the selected word line or bit line. In addition, the peripheral circuit 120 may generate the operation voltage including the verify voltage according to the operation voltage control signal of the verify operation controller 150.

According to an embodiment, the verify operation controller 150 may control the peripheral circuit 120 to perform the verify operation on the selected memory cells among the plurality of memory cells based on the plurality of verify voltages and the compensation value. In different embodiments, any combination of the compensation operation controller 140, the compensation information storage 141, the program loop counter 142, and the verify operation controller 150 may be circuits or processors.

Figure 11:
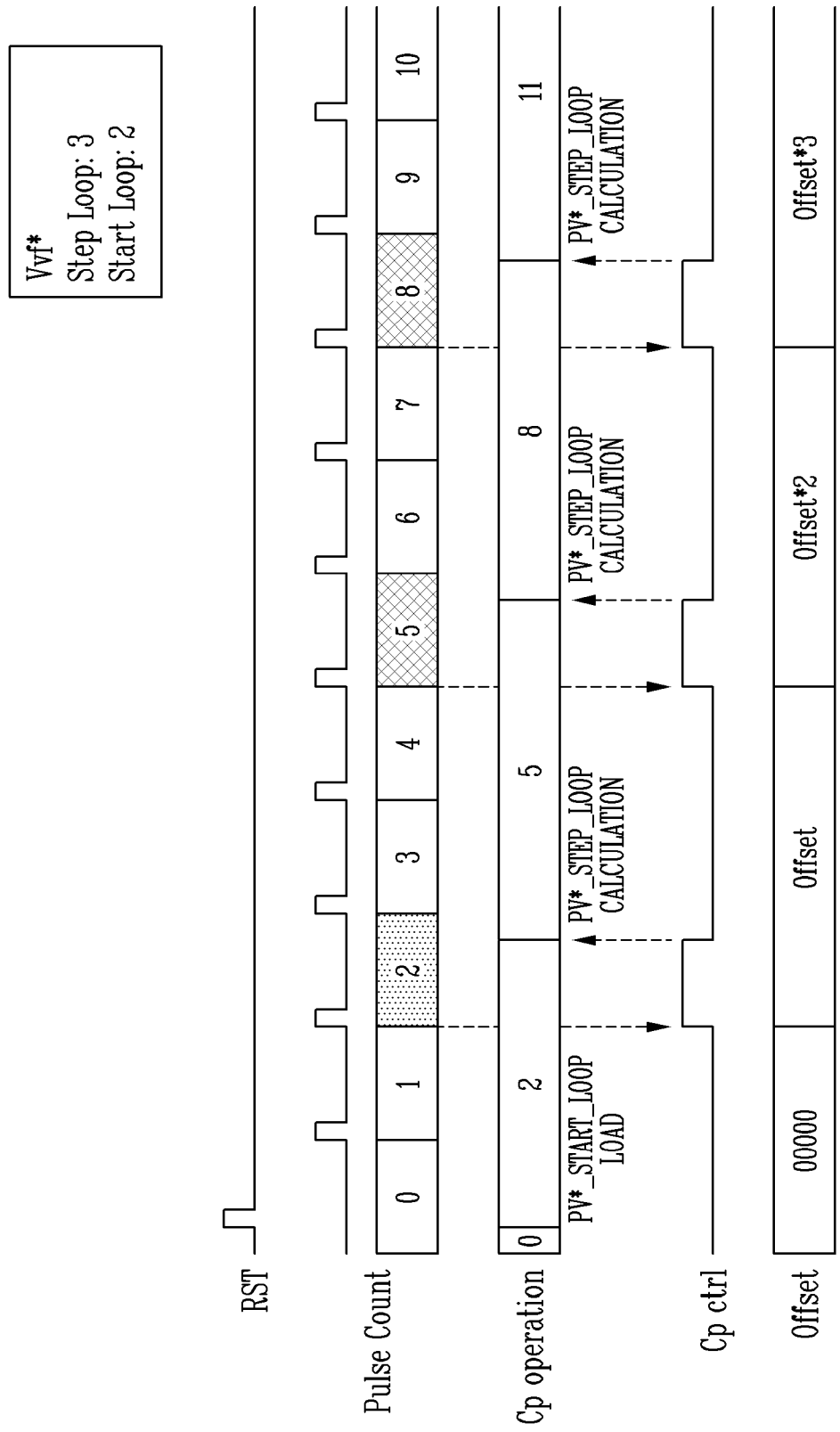
FIG. 11 is a timing diagram illustrating a compensation operation according to an embodiment of the present disclosure.

FIG. 11 is a timing diagram illustrating a compensation operation according to an embodiment of the present disclosure.

Referring to FIG. 11, a diagram illustrating a compensation operation according to a passage of time is shown. Specifically, in response to the program command received from the memory controller 200, the memory device 100 may perform the program operation. Here, the program operation may refer to the program operation in a broad sense, which includes the program period and the program verify period.

In addition, during the program operation, the control logic 130 may generate a reset signal RST. In addition, in response to the reset signal RST, the compensation operation controller 140 may load the compensation information stored in the compensation information storage 141 into the compensation operation controller 140 to perform the compensation operation. When the compensation information is loaded into the compensation operation controller 140, the compensation operation controller 140 may start the compensation operation according to the start loop.

When the program voltage is applied to the selected word line or the selected memory cell, a pulse count signal may be generated by the program loop counter 142 that counts the number of program loops. The pulse count signal generated by the program loop counter 142 may be transmitted to the compensation operation controller 140. In addition, when the number of program loops counted by the program loop counter 142 reaches the start loop, the compensation operation controller 140 may perform the compensation operation of correcting the verify voltage used in the verify operation. For example, in a case where the start loop of the compensation operation on the first verify voltage is 2, when the number of program loops becomes 2, the compensation operation on the first verify voltage may be started. In the compensation operation, the compensation value may be calculated differently according to the plurality of verify voltages or the number of program loops, and the start loop of the compensation operation corresponding to the plurality of verify voltages may be set differently according to each verify voltage.

The compensation operation controller 140 may transmit a compensation control signal CP ctrl to the peripheral circuit 120 so that the program verify operation is performed based on the compensation value calculated according to the compensation operation and a previously set verify voltage. Thereafter, the compensation operation controller 140 may perform the compensation operation according to the compensation information including the step loop, an offset value, and the end loop. For example, when the step loop is 3, the compensation value may be increased or decreased according to the offset bias in the fifth program loop after the second program loop in which the compensation operation is started.

Figure 12:
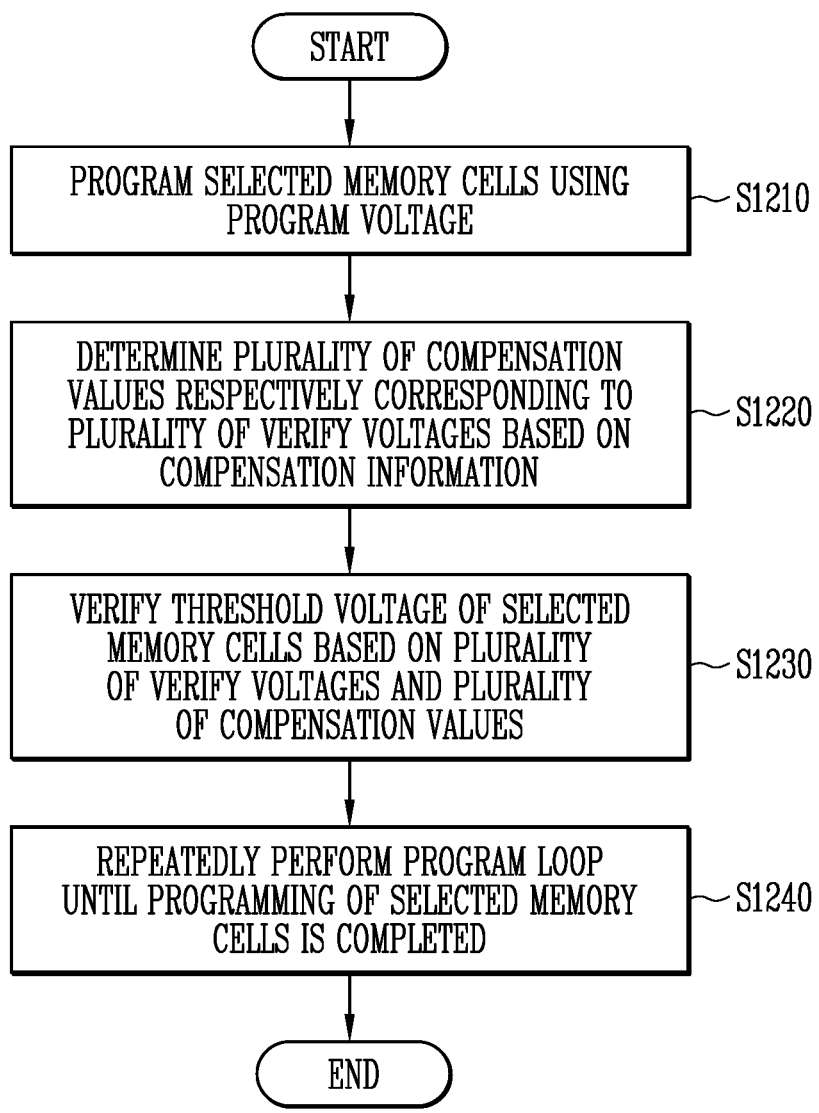
FIG. 12 is a diagram illustrating a method of operating a memory device according to an embodiment of the present disclosure.

FIG. 12 is a diagram illustrating a method of operating a memory device according to an embodiment of the present disclosure.

In response to the program command received from the memory controller 200, the memory device 100 may perform the program operation. Here, the program operation may include a step of programming the selected memory cells and a program verify step of verifying the programmed memory cells.

Specifically, the memory device 100 may include the plurality of memory cells, and may program the selected memory cells among the plurality of memory cells (S1210).

In the program verify step, the memory device 100 may verify the threshold voltage of the selected memory cells using the plurality of verify voltages. According to an embodiment of the present disclosure, the memory device 100 may determine a plurality of compensation values respectively corresponding to the plurality of verify voltages based on the compensation information (S1220). In addition, the memory device 100 may verify the threshold voltage of the selected memory cells based on the plurality of verify voltages and the plurality of compensation values (S1230).

In addition, the program step and the program verify step may configure the program loop, and the program loop may be repeatedly performed until the program operation is completed. The memory device 100 may repeatedly perform the program loop until the programing of the selected memory cells is completed (S1240).

According to an embodiment of the present disclosure, the plurality of compensation values may be set to be increased or decreased as the program loop is repeatedly performed. Alternatively, the plurality of compensation values may be the same as compensation values of a previous program loop.

Figure 13:
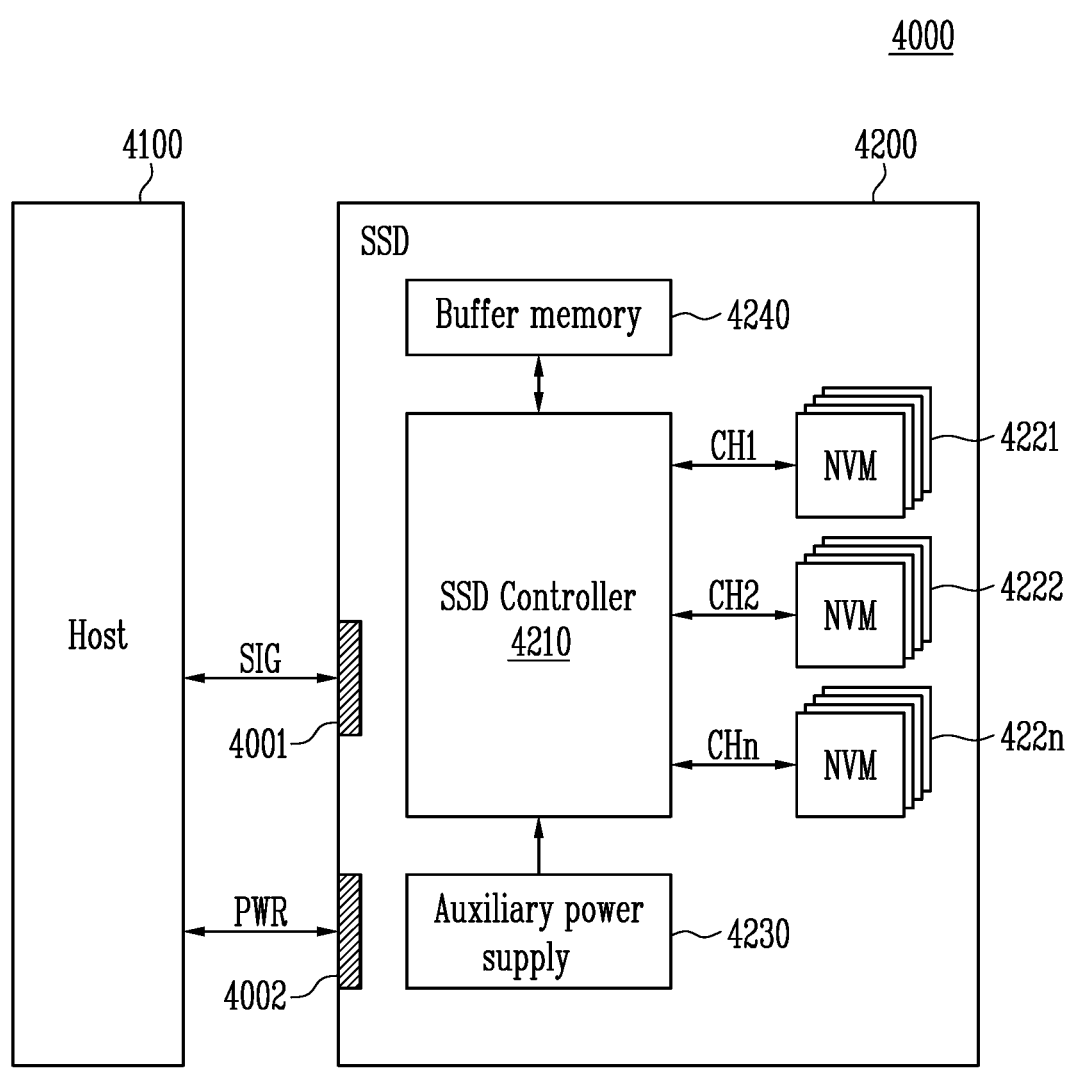
FIG. 13 is a diagram illustrating a solid state drive (SSD) system according to an embodiment of the present disclosure.

FIG. 13 is a diagram illustrating a solid state drive (SSD) system according to an embodiment of the present disclosure.

Referring to FIG. 13, the SSD system 4000 may include a host 4100 and an SSD 4200. The SSD 4200 may exchange a signal SIG with the host 4100 through a signal connector 4001 and receive power PWR through a power connector 4002. The SSD 4200 may include an SSD controller 4210, a plurality of flash memories 4221 to 422n, an auxiliary power supply 4230, and a buffer memory 4240.

In an embodiment, the SSD controller 4210 may perform a function of the memory controller 200 described with reference to FIG. 1. The SSD controller 4210 may control the plurality of flash memories 4221 to 422n in response to the signal SIG received from the host 4100. For example, the signal SIG may be signals based on an interface between the host 4100 and the SSD 4200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 4230 may be connected to the host 4100 through the power connector 4002. The auxiliary power supply 4230 may receive the power PWR from the host 4100 and may charge the power. The auxiliary power supply 4230 may provide power of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as a buffer memory of the SSD 4200. For example, the buffer memory 4240 may temporarily store data received from the host 4100 or data received from the plurality of flash memories 4221 to 422n, or may temporarily store metadata (for example, a mapping table) of the flash memories 4221 to 422n. The buffer memory 4240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

What is claimed is:

1. A memory device comprising:
    a memory cell array including a plurality of memory cells connected to a plurality of word lines;
    a peripheral circuit configured to perform a plurality of program loops each including a program operation on selected memory cells among the plurality of memory cells and a verify operation on the program operation;
    a compensation operation controller configured to determine a compensation value for a plurality of verify voltages according to a progress degree of the program operation and a target program state based on compensation information during the verify operation; and
    a verify operation controller configured to control the peripheral circuit to perform the verify operation on the selected memory cells among the plurality of memory cells based on the plurality of verify voltages to which the determined compensation value is applied,
    wherein the compensation operation controller is configured to:
    change the compensation value whenever program loops corresponding to a step loop are performed from a predetermined loop among the plurality of program loops, and
    apply the changed compensation value to the plurality of verify voltages.

2. The memory device of claim 1, wherein the compensation operation controller is configured to determine the compensation value so that a compensation value for each of the plurality of verify voltages is the same or is increased as a number of program loops increases, based on the compensation information corresponding to each of the plurality of verify voltages.

3. The memory device of claim 1, wherein the compensation operation controller is configured to determine the compensation value so that a compensation value for each of the plurality of verify voltages is the same or is decreased as a number of program loops increases, based on the compensation information corresponding to each of the plurality of verify voltages.

4. The memory device of claim 1, wherein the compensation information includes:
    a start loop corresponding to the predetermined loop and indicating a start time point of a compensation operation of correcting the compensation value to the plurality of verify voltages,
    an end loop indicating an end time point of the compensation operation,
    the step loop indicating a number of program loops applying the same compensation value, and
    an offset value indicating a basic unit by which the compensation value is changed.

5. The memory device of claim 1, wherein the compensation operation controller comprises:
    a program loop counter configured to count a number of program loops indicating the progress degree of the program operation; and a compensation information storage configured to store the compensation information corresponding to each of the plurality of verify voltages, and store the number of program loops.

6. The memory device of claim 5, wherein the compensation operation controller is configured to determine the compensation value for the plurality of verify voltages based on the number of program loops stored in the compensation information storage when the program operation and the verify operation are stopped in response to a stop command requesting a stop of the program operation, and the program operation and the verify operation are resumed in response to a resume command requesting resumption of the program operation.

7. A method of operating a memory device performing a plurality of program loops each including a program step and a program verify step, the method comprising:
the program step of programming selected memory cells among a plurality of memory cells by using a program voltage; and
the program verify step of verifying a threshold voltage of the selected memory cells by using a plurality of verify voltages,
wherein the program verify step determines a plurality of compensation values respectively corresponding to the plurality of verify voltages based on compensation information, and verifies the threshold voltage of the selected memory cells based on the plurality of verify voltages to which the plurality of determined compensation values are applied, and
wherein the program verify step changes the plurality of compensation values whenever program loops corresponding to a step loop are performed from a predetermined loop among the plurality of program loops and applies the plurality of changed compensation values to the plurality of verify voltages.

8. The method of claim 7, further comprising:
repeatedly performing the plurality of program loops until programing of the selected memory cells is completed.

9. The method of claim 8, wherein the plurality of compensation values increase as the plurality of program loops are repeatedly performed or are equal to compensation values of a previous program loop.

10. The method of claim 8, wherein the plurality of compensation values decrease as the plurality of program loops are repeatedly performed or are equal to compensation values of a previous program loop.

11. The method of claim 7, wherein the compensation information includes:
a start loop corresponding to the predetermined loop and indicating a start time point of a compensation operation of correcting the compensation values to the plurality of verify voltages,
an end loop indicating an end time point of the compensation operation,
the step loop indicating a number of program loops applying the same compensation value, and
an offset value indicating a basic unit by which the compensation values are changed.

12. The method of claim 7, further comprising:
counting a number of program loops indicating a number of times the program loop including the program step and the program verify step is performed; and
storing the number of program loops.

13. The method of claim 12, further comprising:
stopping the program step and the program verify step in response to a stop command requesting a stop of the program step; and
resuming the program step and the program verify step in response to a resume command requesting resumption of the program step,
wherein resuming comprises determining the compensation values for the plurality of verify voltages based on the stored number of program loops.

14. A storage device comprising:
a memory device including a plurality of memory cells connected to a plurality of word lines; and
a memory controller configured to control the memory device,
wherein the memory device comprises:
a peripheral circuit configured to perform a plurality of program loops each including a program operation on selected memory cells among the plurality of memory cells and a verify operation on the program operation, and
control logic configured to control the peripheral circuit to determine a compensation value for a plurality of verify voltages according to a progress degree of the program operation and a target program state based on compensation information, and to perform the verify operation based on the plurality of verify voltages to which the determined compensation value is applied,
wherein the control logic is configured to:
change the compensation value whenever program loops corresponding to a step loop are performed from a predetermined loop among the plurality of program loops, and
apply the changed compensation value to the plurality of verify voltages.

15. The storage device of claim 14, wherein the control logic is configured to determine the compensation value so that a compensation value for each of the plurality of verify voltages is the same or is increased as a number of program loops increases, based on the compensation information corresponding to each of the plurality of verify voltages.

16. The storage device of claim 14, wherein the control logic is configured to determine the compensation value so that a compensation value for each of the plurality of verify voltages is the same or is decreased as a number of program loops increases, based on the compensation information corresponding to each of the plurality of verify voltages.

17. The storage device of claim 14, wherein the compensation information includes:
a start loop corresponding to the predetermined loop and indicating a start time point of a compensation operation of correcting the compensation value to the plurality of verify voltages,
an end loop indicating an end time point of the compensation operation,
the step loop indicating a number of program loops applying the same compensation value, and
an offset value indicating a basic unit by which the compensation value is changed.

18. The storage device of claim 14, wherein the control logic is configured to:
count a number of program loops indicating the progress degree of the program operation,
store the compensation information respectively corresponding to the plurality of verify voltages, and
store the number of program loops.

19. The storage device of claim 18, wherein the control logic is configured to:
    stop the program operation and the verify operation in response to a stop command requesting a stop of the program operation, and
    determine the compensation value for the plurality of verify voltages based on the number of program loops stored in the control logic when resuming the program operation and the verify operation in response to a resume command requesting resumption of the program operation.

\* \* \* \* \*